United States Patent [19]

Ogawara et al.

[11] Patent Number: 5,782,292
[45] Date of Patent: Jul. 21, 1998

[54] HEAT SINK FOR AN ELECTRONIC COMPONENT COOLING APPARATUS

[75] Inventors: Toshiki Ogawara, Nagano-ken; Yuichi Kodaira; Tomoaki Ikeda, both of Ueda, all of Japan

[73] Assignee: Sanyo Denki Company, Ltd., Tokyo, Japan

[21] Appl. No.: 720,612

[22] Filed: Oct. 1, 1996

[30] Foreign Application Priority Data

Oct. 5, 1995 [JP] Japan .................................. 7-258526

[51] Int. Cl.⁶ .................................................. H05K 7/20
[52] U.S. Cl. ........................ 165/80.3; 165/122; 165/185; 174/16.3; 257/722; 361/697
[58] Field of Search ...................... 165/80.3, 122, 165/185; 174/16.3; 257/722; 361/695, 697

[56] References Cited

U.S. PATENT DOCUMENTS

| | | |
|---|---|---|
| 5,288,203 | 2/1994 | Thomas . |
| 5,309,983 | 5/1994 | Bailey ................................ 165/80.3 |
| 5,377,745 | 1/1995 | Hsieh ................................ 165/80.3 |
| 5,409,352 | 4/1995 | Lin ................................ 165/80.3 X |
| 5,437,327 | 8/1995 | Chiou ................................ 165/122 |
| 5,559,674 | 9/1996 | Katsui ................................ 361/697 |
| 5,629,834 | 5/1997 | Kodama et al. ................... 361/695 |

*Primary Examiner*—Leonard R. Leo
*Attorney, Agent, or Firm*—Pearne, Gordon McCoy and Granger LLP

[57] ABSTRACT

A heat sink for an electronic component cooling apparatus being small in size and having reduced weight, being capable of coping with increasing amounts of heat generation from the electronic component and capable of performing high cooling efficiency.

A plurality of radiation fins 3 surrounding an impeller of a fan are mounted on a side of a base 2 of a heat sink 1. A heat conductive thick portion comprising linear ribs 4 and an annular rib 5 is formed on the base 2 where it is surrounded by the radiation fins 3. The linear ribs 4 and the annular rib 5, having more thickness than the radiation fin mounting area 6, are formed of a pattern that can reduce the resistance of heat transfer between a heat source opposed-portion 7, which opposes to the heat source of the electronic component and the radiation fin mounting area 6.

3 Claims, 1 Drawing Sheet

HEAT SINK FOR AN ELECTRONIC COMPONENT COOLING APPARATUS

BACKGROUND OF THE INVENTION

This invention relates to a heat sink for an electronic component cooling apparatus, and more particularly, to a heat sink used for cooling an electronic component which generates relatively large amounts of heat.

In an electronic component cooling apparatus for cooling electronic components, such as a microprocessor unit or the like, as disclosed in U.S. Pat. No. 5,288,203, or Japanese Patent Laid-Open Publication No. 111302/1995, an air fan is incorporated in the apparatus for efficiently radiating heat from the heat sink. The heat sink includes a plurality of radiation fins mounted on a base plate in a manner that the radiation fins surround an impeller of the fan. The impeller comprises a cup-like impeller member having a plurality of blades.

Recently, an electronic component, such as a microprocessor unit, tends to generate increased heat in a central region, or to have a heat generation source at a position deviated from the central region, or to have heat generation sources at a plurality of dispersed positions. The increase of the heat generation and the deviation and dispersion of the heat generation sources can be coped with by increasing the size of the cooling apparatus. However, increasing the cooling apparatus in size has caused problems of installation space and increased weight of the cooling apparatus.

SUMMARY OF THE INVENTION

The present invention has been made in view of the foregoing problems of the prior art.

Accordingly, it is an object of the present invention to provide a heat sink for an electronic component cooling apparatus which can solve the problems as mentioned above.

It is another object of the present invention to provide a heat sink for an electronic component cooling apparatus which is capable of coping with increased heat generation by the electronic component without incorporating a fan of high capability.

It is a further object of the present invention to provide a heat sink for an electronic component cooling apparatus which is capable of efficiently cooling an electronic component having heat generating sources positioned outside of a central region of a base of the heat sink.

It is still another object of the present invention to provide a heat sink for an electronic component cooling apparatus which is capable of solving the above-mentioned problems without significantly increasing the overall weight of the cooling apparatus.

In accordance with the present invention, a heat sink for an electronic component cooling apparatus is provided. The heat sink comprises a base, one side of which is for directly or indirectly mounting an electronic component and the other side of which is for mounting a fan having an impeller including a plurality of blades, and a plurality of radiation fins arranged so as to surround the impeller and provided on the side of the base; wherein a region of the base surrounded by the radiation fins is thicker than a radiation fin mounting area of the base where the radiation fins are mounted, and a heat conductive thick portion is formed so as to reduce resistance of heat transfer between a heat source opposed-portion which opposes or corresponds to a heat source of the electronic component and the radiation fin mounting area.

In other words, the heat-conductive thick portion is formed in a pattern that is to reduce resistance of heat transfer between the heat source opposed-portion which opposes to the heat source of the electronic component and the radiation fin mounting area. The pattern and the cross section of the heat conductive thick portion can be selectively formed in any of those capable of reducing the resistance of heat transfer between the heat source opposed-portion and the radiation fin mounting area. The term of resistance of heat transfer R referred to here is defined as:

$$R = L/(k \times S)$$

L is heat transfer distance, k is conductivity of the material, and S is the area of the cross section where the heat is transferred.

For the electronic component having plural heat generation sources, theoretically, the heat conductive thick portion should be formed to extend from each heat source opposed-portion, which opposes to each heat source, to the radiation fin mounting area. However, if the plural heat sources are closely positioned with each other, they can be regarded as one heat source, and the heat conductive thick portion can be formed to extend from the assumed heat source opposed-portion to the radiation fin mounting area.

The heat conductive thick portion formed in accordance with the invention functions to enhance the radiation efficiency, allowing the effective heat conduction from the heat source opposed-portion to the radiation fins through the heat conductive thick portion. Further, in accordance with the invention, even if the electronic component has a heat source positioned at a point deviated from the center of the component, the heat radiation can be made efficiently from the radiation fins. Furthermore, in accordance with the present invention, the construction of the base having a heat conductive thick portion enables the reduction of the overall weight of the heat sink compared with adopting a whole thick base. The thick base generally leads to high conductive efficiency, but requires increasing the weight of the heat sink.

The heat conductive thick portion is preferably formed on a side of the base opposite to the side where the electronic component is directly or indirectly mounted, and formed to extend away from the base. In this construction, the heat conductive thick portion is formed not to disturb the installation of the electronic component.

The heat conductive thick portion may comprise plural liner ribs extending from the heat source opposed-portion to the radiation fin mounting area and an annular rib connected to plural radiation fins and also connected to the outer ends of the linear ribs. The heat from the heat source is conducted to the radiation fins through the linear ribs and then the annular rib. The annular rib can be substantially annular, which means the annular rib is not necessarily a closed circle, but may be a circle having some breaks.

If the linear ends of the plural linear ribs extend into the central region, the construction of the linear ribs functions as reinforcement for the base and also functions to conduct the heat from the heat source opposed-portion to each linear rib.

BRIEF DESCRIPTION OF THE DRAWINGS

These and other objects and advantages and further description will now be discussed in connection with the drawings in which.

DETAILED DESCRIPTION OF THE PREFERRED EMODIMENTS

A heat sink for an electronic component cooling apparatus in accordance with the present invention will be described hereinafter with reference to the accompanying drawings.

Figure 1A:
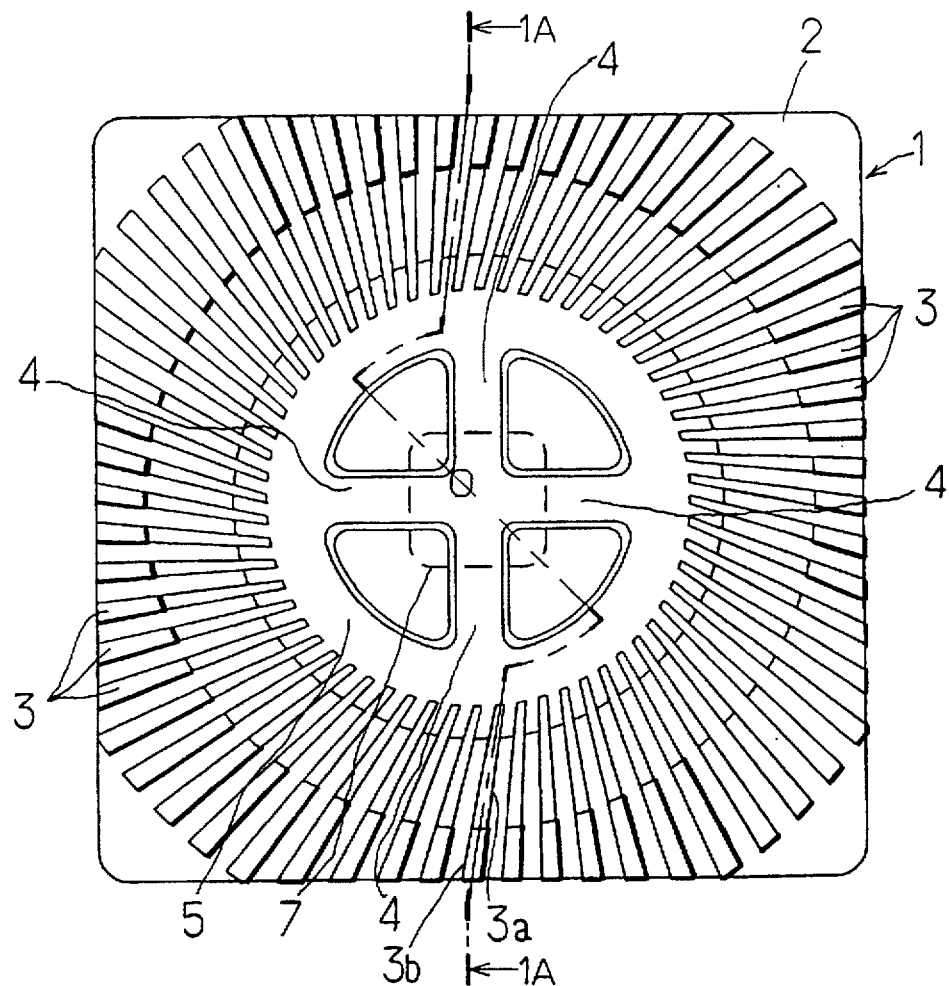
FIG. 1(A) is a plan view of a heat sink for an electronic component cooling apparatus used for cooling a microprocessor unit in accordance with a preferred embodiment of this invention.
Figure 1B:
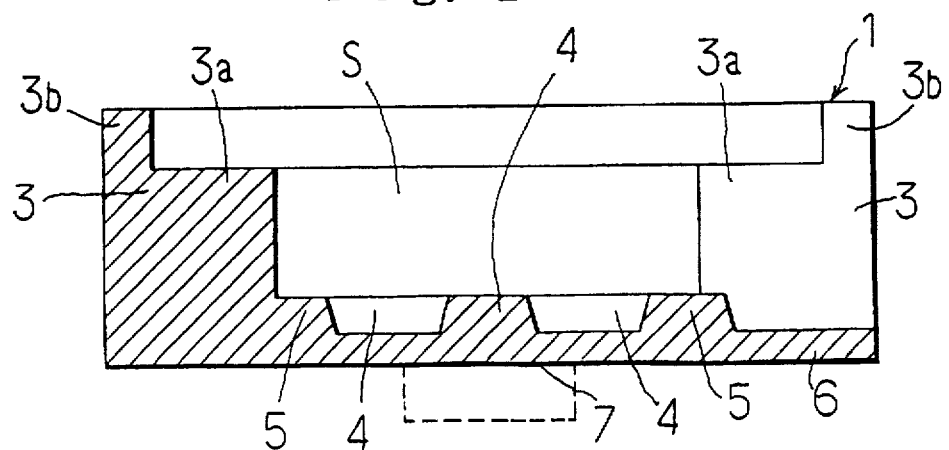
FIG. 1(B) is a sectional view taken along line A—A of FIG. 1(A).

Referring to FIGS. 1(A) and 1(B), an embodiment of a heat sink for an electronic component cooling apparatus in accordance with the present invention is illustrated. A heat sink 1 integrally formed by monobloc casting, comprises a base 2, a plurality of radiation fins 3, four linear ribs 4, and an annular rib 5.

The base 2 is formed into a contour of a substantially rectangular or square shape and is provided with an electronic component which is mounted on one of the surfaces or on a reverse of the base 2. The electronic component may be directly mounted on the reverse of the base, or a holder of the electronic component may be fixed to the reverse of the base 2 by means of adhesives or fittings to be indirectly mounted on the base 2.

The radiation fins 3 are arranged so as to upwardly extend from a radiation fin mounting area 6 on the other side, or on the obverse of the base 2, and may be sixty in number. The radiation fins 3 are arranged not in a simple radial manner, but into such a configuration as to smoothly propel spiral air flow caused by rotation of blades attached on an impeller (not shown) from the center of the base 2 into the outward direction. Each radiation fin 3 is shaped to have a configuration that a vertical length or height of an inner portion 3a is lower than that of the outer portion 3b and formed to inwardly gradually reduce thickness. The inner distal ends of the radiation fins 3 are arranged to make substantially a circle in profile.

In a space S surrounded by the radiation fins 3, a part of the impeller of a fan (not shown) is received. At least a part of the impeller is surrounded by the radiation fins 3, or the whole impeller may be surrounded by the radiation fins according to the shape of the radiation fins 3. The fan used for the heat sink in this preferred embodiment of the present invention has a particular construction, as disclosed in Japanese Patent Laid-Open Publication No. 111302/1995, that a part of the impeller extends out of a fan housing. The fan is mounted on the heat sink 1 by means of projections or hooks provided on the fan housing that engage with the counter elements formed on the base 2. The fan can be mounted on the heat sink 1 by any other suitable means in such a manner that the fan housing is fixed by screws to pillars provided on the base 2.

The linear ribs 4 and the annular rib 5 extend away from the base 2 in a central region inside the radiation fin mounting area 6. They are formed to gradually reduce thickness in the cross section as they extend away from the base 2. In the illustrated embodiment the central region, or a place where four linear ribs 4 are assembled, is a heat source opposed-portion 7 that is opposite the heat source of the electronic component mounted on the reverse of the base 2. For the purpose of better understanding, the heat source opposed-portion 7 is indicated by the broken line in FIG. 1(A), and the heat source is indicated by the broken line in FIG. 1(B). The four linear ribs 4 each extend outwardly from the heat source opposed-portion 7 toward the radiation fin mounting area 6 in the direction perpendicular to each side of the base 2. Thus, the angle between each adjacent two linear ribs 4 is 90°, and the pattern formed by the four ribs 4 is cross-shaped.

The annular rib 5 is annularly formed to interconnect each inner end of the radiation fin 3. In the illustrated embodiment, the linear ribs 4 and the annular rib 5 form a heat conductive thick portion which has more thickness than the radiation fin mounting area 6 in which the radiation fins 3 are provided. The heat conductive thick portion is formed so as to reduce heat resistance between the heat source opposed-portion 7, which opposes to the heat source of the electronic component, and the radiation fin mounting area 6.

The heat generated from the heat source of the electronic component is conducted from the heat source opposed-portion 7 to the annular rib 5 on the base 2 of the heat sink 1 mainly through the linear ribs 4, a thicker portion of the base 2 which has less heat resistance, and then radiated through the radiation fins 3. Thus, high radiation efficiency can be achieved by merely changing the construction of the heat sink as seen in this illustrated embodiment in accordance with the present invention.

This illustrated embodiment includes four linear ribs 4. However, the number of the linear ribs may be selectively determined, depending on the amount of heat generated from the heat source. Forming too many linear ribs on the base does not necessarily improve the radiation efficiency, but may only result in increasing the weight. In the illustrated embodiment, the four ribs are assembled in the central region so that the heat can be conducted to the annular rib 5 dividedly through each linear rib 4, even if the position of the heat generation source is deviated from the central region. Thus, the construction of the illustrated embodiment can be used widely adapting for the electronic components of various types.

In the illustrated embodiment, the annular rib 5 is formed into a closed loop, the construction of which enables high radiation efficiency as the heat conducted from each linear rib 4 can be mostly equally conducted to each radiation fin for radiation. If the linear ribs 4 are formed having more width or having wider outer ends, the annular rib 5 is not necessary to be formed. The annular rib may not always be formed into a closed loop, but it may have breaks.

In the illustrated embodiment, a heat source of the electronic component is positioned roughly in the center of the base 2 of the heat sink 1. If the position of the heat source is greatly deviated from the center, the linear ribs 4 may be formed to assemble in the position in response to the heat source opposed-portion. However, if the deviation from the center is limited to a small extent, the construction of the illustrated embodiment is adaptable.

If the heat sink is used for an electronic component having several heat sources which are positioned apart from each other, the heat sink inevitably has several heat source opposed-portions. For such a heat sink, the plural linear ribs that form a heat conductive thick portion should be formed from each of the heat source opposed -portions to the radiation fin mounting area. However, the plural heat sources can be regarded as one heat source, with one heat source opposed-portion. Accordingly, a heat conductive thick portion is formed to extend from the assumed heat source opposed-portion to the radiation fin mounting area.

In accordance with the present invention, a heat conductive thick portion functions to increase the radiation efficiency, as the heat is efficiently conducted from the heat source opposed-portion to the radiation fins through the heat conductive thick portion. Also, even if the position of the heat source is deviated from the center of the electronic component, the heat can be radiated efficiently and dividedly from the radiation fins. Further, in accordance with the present invention, the construction having a heat conductive thick portion enables the heat sink to reduce the overall weight compared with adopting a whole thick base.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A heat sink for an electronic component cooling apparatus comprising:

a base having one side for providing an electronic component and another side for providing a fan having an impeller including a plurality of blades;

a plurality of radiation fins being arranged so as to surround said impeller and provided on said other side of said base;

a heat conductive thick portion formed on a region of said base surrounded by said radiation fins, being thicker than a radiation fin mounting area where said radiation fins are mounted, and being formed to reduce resistance of heat transfer between a heat source opposed-portion which opposes to a heat source of said electronic component and said radiation fin mounting area;

said heat conductive thick portion comprising a plurality of linear ribs formed to extend from said heat source opposed-portion to said radiation fin mounting area and an annular rib connected to said plurality of radiation fins and outer ends of said plurality of linear ribs.

2. A heat sink as defined in claim 1, wherein inner ends of said plurality of linear ribs are assembled in a central region of said base.

3. A heat sink as defined in claim 1, wherein said linear ribs and said annular rib are formed to gradually reduce thickness in the cross section as they extend away from said base.

* * * * *